(12) United States Patent
Xue et al.

(10) Patent No.: US 11,244,718 B1
(45) Date of Patent: Feb. 8, 2022

(54) CONTROL OF NAND FLASH MEMORY FOR AI APPLICATIONS

(71) Applicant: Alibaba Group Holding Limited, George Town (KY)

(72) Inventors: Fei Xue, Sunnyvale, CA (US); Dimin Niu, Sunnyvale, CA (US); Shuangchen Li, Sunnyvale, CA (US); Hongzhong Zheng, Sunnyvale, CA (US)

(73) Assignee: Alibaba Group Holding Limited

( * ) Notice: Subject to any disclaimer, the term of this patent is extended or adjusted under 35 U.S.C. 154(b) by 0 days.

(21) Appl. No.: 17/014,691

(22) Filed: Sep. 8, 2020

(51) Int. Cl.
| | | |
|---|---|---|
| *G11C 11/4093* | (2006.01) | |
| *G11C 11/4096* | (2006.01) | |
| *G06F 17/16* | (2006.01) | |
| *G11C 11/4074* | (2006.01) | |
| *G11C 11/408* | (2006.01) | |

(52) U.S. Cl.
CPC .......... *G11C 11/4096* (2013.01); *G06F 17/16* (2013.01); *G11C 11/4074* (2013.01); *G11C 11/4085* (2013.01); *G11C 11/4093* (2013.01)

(58) Field of Classification Search
CPC ............ G11C 11/4096; G11C 11/4085; G11C 11/4074; G11C 11/4093; G06F 17/16
USPC ........................ 365/185.24, 230.03
See application file for complete search history.

(56) References Cited

U.S. PATENT DOCUMENTS

| | | |
|---|---|---|
| 9,202,578 B2 | 12/2015 | Rhie |
| 10,014,318 B2 | 7/2018 | Or-Bach |
| 10,055,383 B1 * | 8/2018 | Shafiee Ardestani ........................ G11C 13/0023 |
| 10,360,971 B1 * | 7/2019 | Hokenmaier .......... G06N 3/082 |
| 10,528,643 B1 * | 1/2020 | Choi ........................ G06F 17/16 |
| 10,777,259 B1 * | 9/2020 | Wang ..................... G11C 11/412 |
| 10,878,270 B1 * | 12/2020 | Cao ......................... G06K 9/325 |
| 2009/0172053 A1 * | 7/2009 | Nam ....................... G06F 17/16 708/209 |
| 2009/0248778 A1 * | 10/2009 | Magerlein ............... G06F 17/16 708/520 |
| 2011/0078226 A1 * | 3/2011 | Baskaran ................ G06F 17/16 708/607 |
| 2017/0277659 A1 * | 9/2017 | Akerib ..................... G06N 3/08 |
| 2018/0247190 A1 * | 8/2018 | Chung ............. H03K 19/17796 |
| 2019/0035449 A1 * | 1/2019 | Saida ..................... G11C 11/161 |
| 2019/0057050 A1 * | 2/2019 | Mathuriya ............. G06N 3/063 |
| 2019/0057727 A1 * | 2/2019 | Mathuriya ........... G11C 7/1003 |
| 2019/0087719 A1 * | 3/2019 | Seo ........................ G11C 11/412 |
| 2019/0361954 A1 * | 11/2019 | Page ..................... G06F 3/0604 |
| 2019/0370642 A1 * | 12/2019 | Liu ....................... G06N 3/0472 |
| 2020/0026746 A1 * | 1/2020 | Tu ............................ G06F 17/16 |
| 2020/0133845 A1 * | 4/2020 | Kim ....................... G06F 12/121 |
| 2020/0279012 A1 * | 9/2020 | Khaddam-Aljameh ..................... G06G 7/22 |
| 2020/0311523 A1 * | 10/2020 | Hoang ..................... G11C 11/54 |
| 2020/0410334 A1 * | 12/2020 | Choi .................. G11C 13/0028 |
| 2021/0072986 A1 * | 3/2021 | Yudanov .................. G06N 3/00 |
| 2021/0110235 A1 * | 4/2021 | Hoang ..................... G06N 3/04 |

(Continued)

*Primary Examiner* — Michael T Tran

(74) *Attorney, Agent, or Firm* — Van Pelt, Yi & James LLP

(57) ABSTRACT

A system comprises: a three-dimensional flash memory comprising a plurality of cells; and a controller coupled to the three-dimensional flash memory, configured to: select a block of cells in the three-dimensional flash memory; perform a matrix multiplication on the matrix stored in the block of cells, including performing a vector multiplication in a single sensing step; and output a matrix multiplication result. A matrix is stored in the block of cells.

20 Claims, 8 Drawing Sheets

(56) References Cited

U.S. PATENT DOCUMENTS

2021/0110244 A1* 4/2021 Hoang .................. G06N 3/063
2021/0149984 A1* 5/2021 Luo ..................... G06F 12/0207

* cited by examiner

US 11,244,718 B1

CONTROL OF NAND FLASH MEMORY FOR AI APPLICATIONS

BACKGROUND OF THE INVENTION

The growing disparity of speed between the Central Processing Unit (CPU) and memory outside the CPU chip (also referred to as the "memory wall") has been proven to be a more and more significant issue in today's big data era. High bandwidth and power efficient memory is desired to break performance bottleneck.

There are currently three primary memory types that power artificial intelligence (AI) systems and applications. However, all these memory solutions have some issues with capacity, power, and/or cost. One type of memory is the on chip memory (usually static random-access memory (SRAM)), which offers highest bandwidth and power efficiency. Its capacity, however, is limited as the area of logic chip is costly. Another type of memory is the double data rate (DDR) interfaced dynamic random-access memory (DRAM) using traditional chip-on-PCB manufacturing, which has higher capacity compared to on chip memory, but bandwidth limited by off chip connection. A third type of memory is the high-bandwidth memory (HBM) using the through-silicon via (TSV) technique to integrate components, which has higher bandwidth, higher density, and more power efficiency compared to DDR DRAM, but is far more expensive.

Furthermore, AI systems and applications often require manipulation of large matrices, such as matrix multiplication operations. Such operations on traditional memory chips usually involve multiple steps and are inefficient.

Higher density, more power efficient, and lower cost memory system solutions, in particular, solutions aimed at more efficient computation of matrix operations, are needed to accompany today's AI systems.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
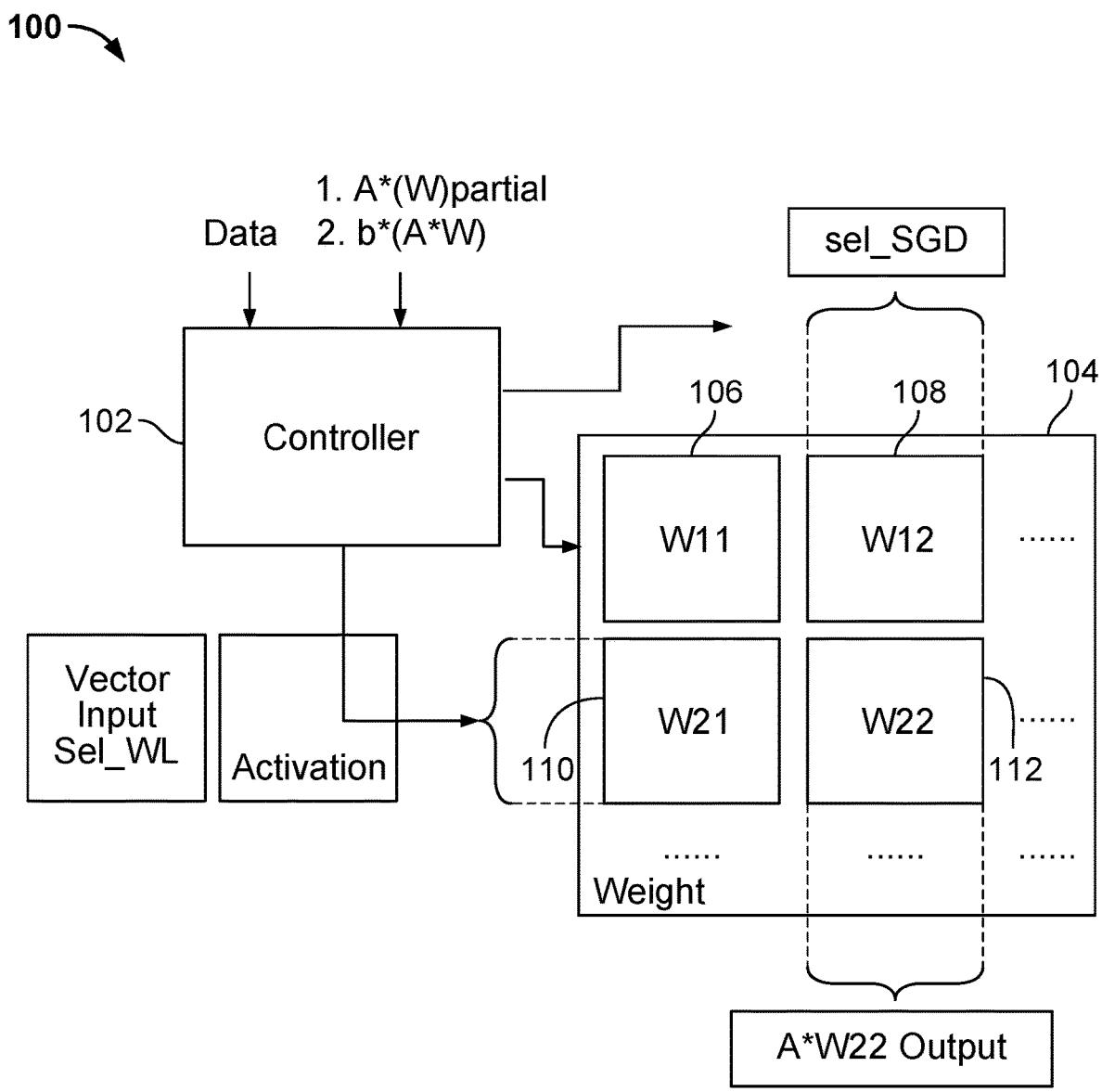
FIG. 1 is a block diagram illustrating an embodiment of a flash memory-based AI accelerator.

FIG. 1 is a block diagram illustrating an embodiment of a flash memory-based AI accelerator. Device 100 is designed to accelerate computations for AI applications (including machine learning) to implement matrix operations efficiently. In this example, system 100 includes a controller 102 and a flash memory 104. Flash memory 104 is divided into multiple partitions, where each partition stores a corresponding set of weight matrix data. In some embodiments, all the data stored in flash memory 104 is viewed as a single matrix, and each partition is referred to as a partial matrix. As shown, partitions 106, 108, 110, and 112 store partial matrices W11, W12, W21, and W22, respectively. Different numbers of partitions can be achieved in other embodiments. In some embodiments, flash memory 104 is viewed as a building, and the partial matrices are referred to as tenants. Since the partial matrices can be weight matrices owned by different applications, they are also referred to as multiple tenant weight matrices.

The controller is configured to select one or more blocks and multiply matrix data stored in the selected block(s) with an activation matrix A or a scalar value b. As will be described in greater detail below, the selection can be performed using signals on the select gate drain (SGD) and the word line. The activation matrix (e.g., a matrix commonly used in machine learning/artificial intelligence applications to model a neural network) can be provided using voltages on the word line, and the scalar value can be provided using a voltage on the source plate. Further, the controller can enable multiple matrix multiplications to be performed in parallel as needed. For example, the activation matrix A can be multiplied with W21 and W12 substantially in parallel (simultaneously or nearly simultaneously). By performing the multiplications in memory, reducing the number of sensing steps for the computations, and allowing parallel execution, system 100 accelerates the matrix computations often required by AI applications.

Figure 2:
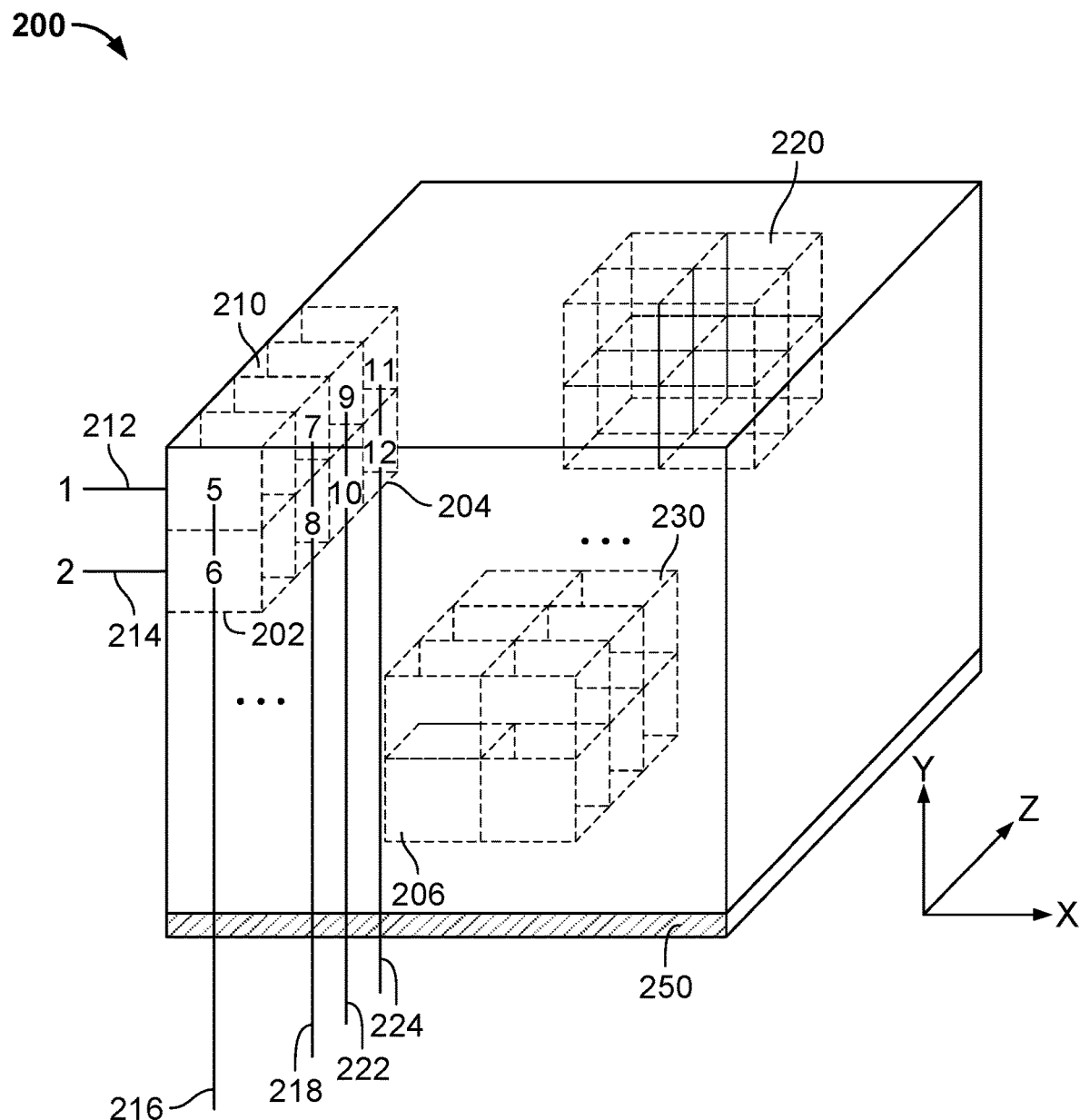
FIG. 2 is a three-dimensional block diagram of an embodiment of a NAND device.

In some embodiments, flash memory 104 is implemented using a three-dimensional NAND device. FIG. 2 is a three-dimensional block diagram of an embodiment of a NAND device. In this example, three-dimensional NAND 200 can be used to implement 104 of system 100. NAND cells are illustrated as cubes such as 202, 204, etc. The NAND cells are partitioned into blocks. Each block of cells forms a cuboid such as 210, 220, 230, etc. Each cuboid stores matrix data for a particular weight matrix (e.g., W11, W12, etc. of FIG. 1). The controller is configured to address and select a specific cuboid storing a partial matrix (tenant) using pre-specified commands. In some embodiments, the controller is configured to specify the location and boundaries of the cuboid by selecting certain SGDs and word lines. For example, cuboid 210 is specified to start at cell 202, and extend 1 cell, 2 cell, and 4 cells in the X, Y, and Z directions, respectively; cuboid 230 starts with cell 206, and extends 2 cells, 2 cells, and 3 cells in the X, Y, and Z directions, respectively. Other specification schemes can be employed in other embodiments.

The values of the weight matrix are preloaded into the appropriate memory cells. Values of vectors in the activation matrix are set by configuring select word lines with appropriate voltages. When a word line voltage is applied to the corresponding cells, it will change the resistors in those cells and cause each cell to store a value that corresponds to the product of the original stored value and the value of the word line. For example, suppose that an activation matrix $$A = \begin{bmatrix} 1 & 2 \\ 3 & 4 \end{bmatrix}$$

is to be multiplied with a weight matrix $$\begin{bmatrix} 5 & 7 & 9 & 11 \\ 6 & 8 & 10 & 12 \end{bmatrix}.$$

As shown, the weight matrix is stored in cuboid 210. The cells in the same vertical column form a string and are connected to the same bit line. Examples of bit lines 216, 218, 222, and 224 are shown. Performing matrix multiplication includes performing vector multiplication. The values of the first vector of the activation matrix, [1 2], are set on word lines 212 and 214, respectively. Each word line is connected with a horizontal layer of cells in the NAND device. When the voltage on a word line is applied to the layer of cells connected to the word line, the values on the word lines are multiplied with the respective values in the NAND cells. As shown, 1 is multiplied with 5, 7, 9, and 11, and 2 is multiplied with 6, 8, 10, and 12.

The current of cells in the same vertical column are added to their corresponding bit lines, which has the effect of accumulating the products of the entries at the bit lines. The value of the accumulated products is equal to the inner product of the vectors. At the bit line output, each accumulated product can be determined with a single sensing step by sensing the value on the bit line. For example, accumulated product (1*5+2*6) is output to bit line 216, accumulated product (1*7+2*8) is output to bit line 218, and so on. As such, each of the accumulated products is sensed on the corresponding bit line using a single sensing step. Once the inner products for [1 2] are computed, 3 and 4 are loaded on to the word line so that the inner products for the vector [3 4] and the vectors in the weight matrix can be computed. Although the weight matrix is shown to be stored in a 1×2×4 cuboid, in other embodiments, the weight matrix can be stored in a cuboid having different dimensions (e.g., a 2×2×1 cuboid), and the accumulated vector products can be similarly output and sensed on the bit line.

In this example, a source plate 250 is connected to the ends of the strings of cells. Without any voltage applied to the source plate, the current equals bit line voltage divided by the total resistance of the string (i.e., $V_{bl}/R_{string\_total}$). When a voltage $V_{sgs}$ is applied to source plate 250, the current equals the difference between the bit line voltage and $V_{sgs}$, divided by the total resistance of the string (i.e., $(V_{bl}-V_{sgs})/R_{string\_total}$). The current value, which is proportional to the voltage applied to the source plate, is sensed on the bit line by the sensing circuit. Therefore, applying the voltage $V_{sgs}$ to the cells in the cuboid is equivalent to multiplying a scalar value b to the matrix M stored in the cells. In some embodiments, there can be a one-to-one mapping of the voltage value and the scalar value b, which can be looked up or derived using a function.

In one aspect, the controller is configured to be able to select multiple cuboids (e.g., 210 and 220) at the same time and perform matrix multiplications in parallel. Cuboids to be multiplied with the same activation matrix can share the same word lines, and cuboids to be multiplied with different activation matrices can each have their own set of word lines.

Figure 3:
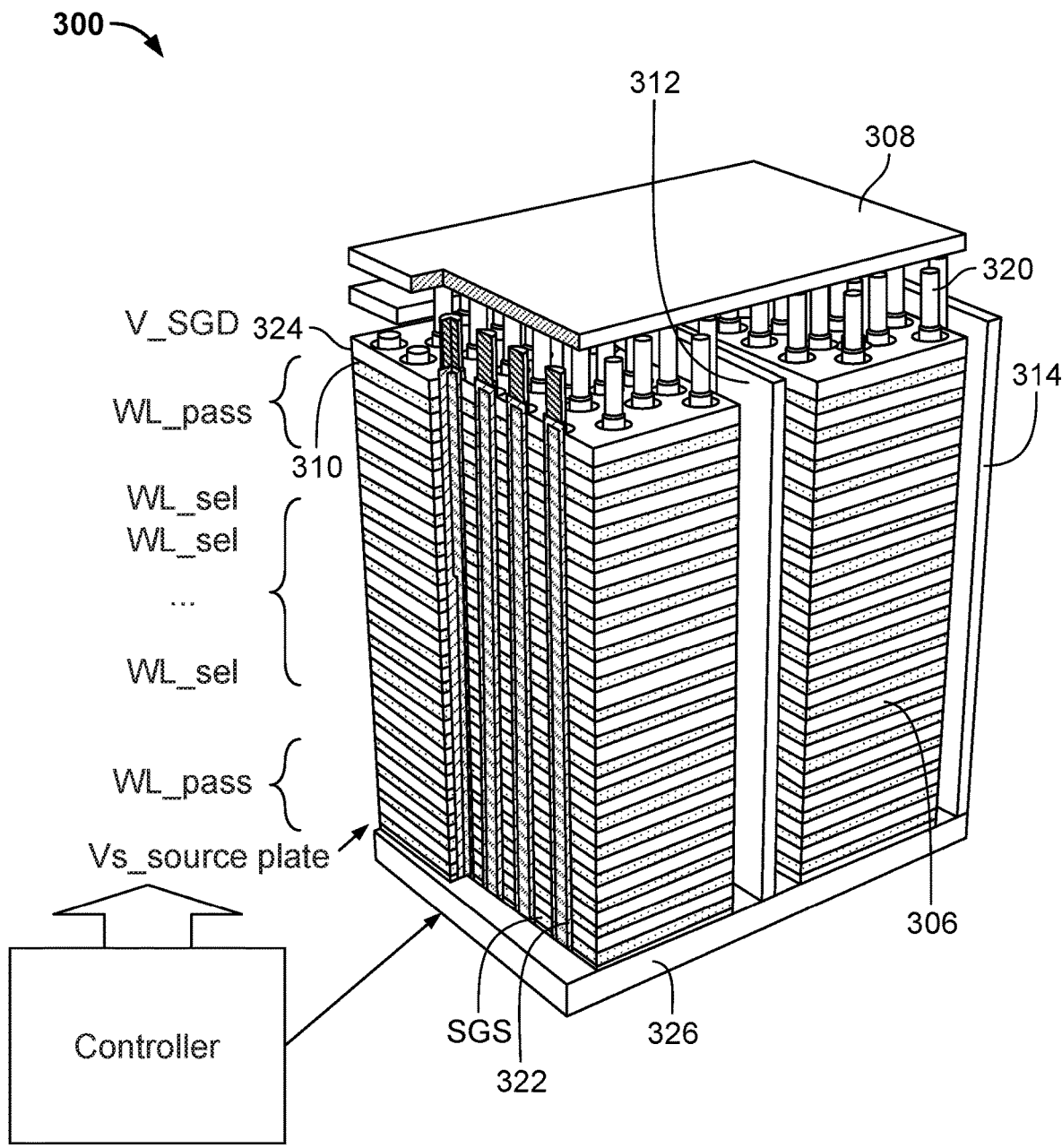
FIG. 3 is a structural diagram illustrating an embodiment of a flash memory-based AI accelerator.

FIG. 3 is a structural diagram illustrating an embodiment of a flash memory-based AI accelerator. In this example, device 300 includes a plurality of cell arrays 306. The cell arrays are three-dimensional, where each flash memory cell array includes multiple layers of flash memory cells. In each layer, there are multiple flash memory cells. The 3D cell arrays can be implemented using standard 3D flash memory cells (e.g., 3D NAND cells).

As shown, the 3D flash memory cells are coupled to a bit line circuitry 308, which is configured to provide voltage to the memory cells. A plurality of pillars 320 connect the bit line circuitry and the memory cells. Each column controls a string of cells such as 322. Interlayer electrical connections such as staircase connections (not shown) can be made between individual layers in the 3D cell array. Select gate drains (SGDs) are formed on plate 324 which is located underneath the pillars. In this example, two SGDs are separated by isolation planes 312 and 314. There can be many more SGDs in other embodiments. When a signal V_SGD is applied to a particular SGD, the SGD will select columns of cells that are controlled by the SGD. The signals WL_sel select the specific layer of cells. Together, the SGD and WL_sel signals select the cells that form a particular cuboid.

The flash memory cells in the cell arrays are connected to a logic circuitry, which implements matrix multiplication related operations to be performed on the flash memory cells, such as read/write, controls, etc. In some embodiments, the logic circuitry is implemented on bottom plate 326 of the cell arrays. A set of commands associated with these operations are implemented such that the host, the controller, and the NAND cells can communicate with each other and carry out the operations.

Device 300 further includes a sensing circuitry (not shown), which can be implemented on the same bottom plate as the logic circuitry, or formed on a separate die that is attached to the logic circuitry using through-silicon vias (TSVs), 3D wafer bonding, etc.

The controller on the logic circuitry performs control functions such as reading and writing, activating the signals to select cuboids (partial matrices), performing matrix operations (including multiplying WL_sel values with the weight matrix values stored in the cuboid, and multiplying a scalar value with the weight matrix), etc.

Figure 4:
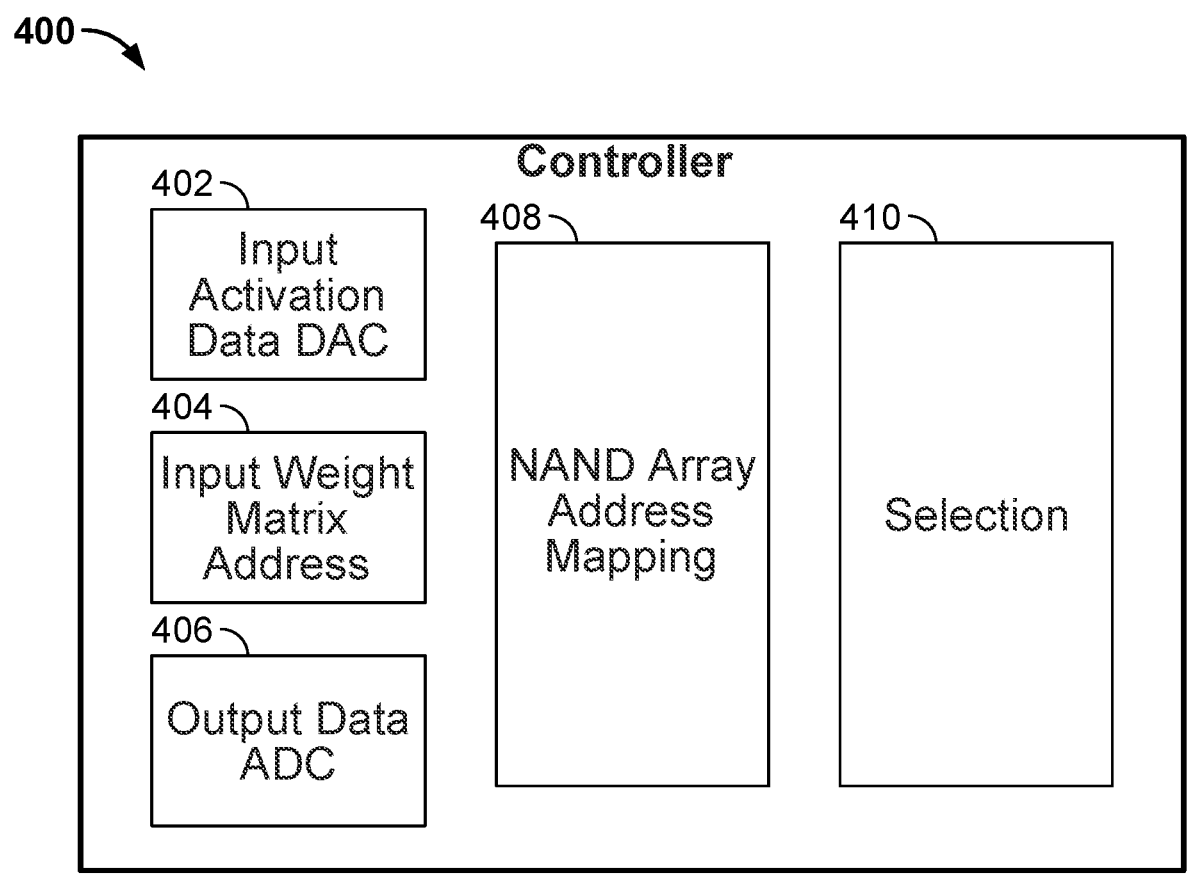
FIG. 4 is a block diagram of an embodiment of a controller.

FIG. 4 is a block diagram of an embodiment of a controller. Controller 400 has several functional blocks, including an input activation data digital to analog converter (DAC) 402, an input weight matrix address module 404, an output data analog to digital converter (ADC) 406, a NAND array address mapping module 408, and a selection module 410.

Input activation data DAC 402 is configured to convert the digital signals that correspond to the activation matrix values into analog voltages, which are applied to select NAND cells. Input weight matrix address module 404 is configured to store information about the tenants (cuboids), such as the size, location, boundary coordinates, etc. Using this information, NAND array address mapping module 408 maps any selected tenants (cuboids) to the appropriate NAND cells. Selection module 410 specifies the signals that are sent to the NAND cells, such as blk_sel (block selection), SGD_sel (SGD selection), WL_sel (word line select), WL_unsel (word line unselect), SGS_sel (SGS selection), Vs (source plate voltage), etc. In particular, the selection module applies appropriate voltages to the selected signal lines. When voltages corresponding to input activation data are applied to the appropriate cells, the data is multiplied and accumulated, and the result is sensed in one sensing step by a sensing circuit. The sensed voltages are sent to output ADC 406 to be converted from analog to digital, and output to the requester (e.g., an AI application that requested multiplication of matrices).

The modules described above can be implemented as software components executing on one or more processors, as hardware components such as programmable logic devices (e.g., microprocessors, field-programmable gate arrays (FPGAs), digital signal processors (DSPs), etc.), Application Specific Integrated Circuits (ASICs) designed to perform certain functions, or a combination thereof. In some embodiments, the modules can be embodied by a form of software products which can be stored in a nonvolatile storage medium (such as optical disk, flash storage device, mobile hard disk, etc.), including a number of instructions for making a computer device (such as personal computers, servers, network equipment, etc.) implement the methods described in the embodiments of the present application. The modules may be implemented on a single device or distributed across multiple devices. The functions of the modules may be merged into one another or further split into multiple sub-modules.

Figure 5:
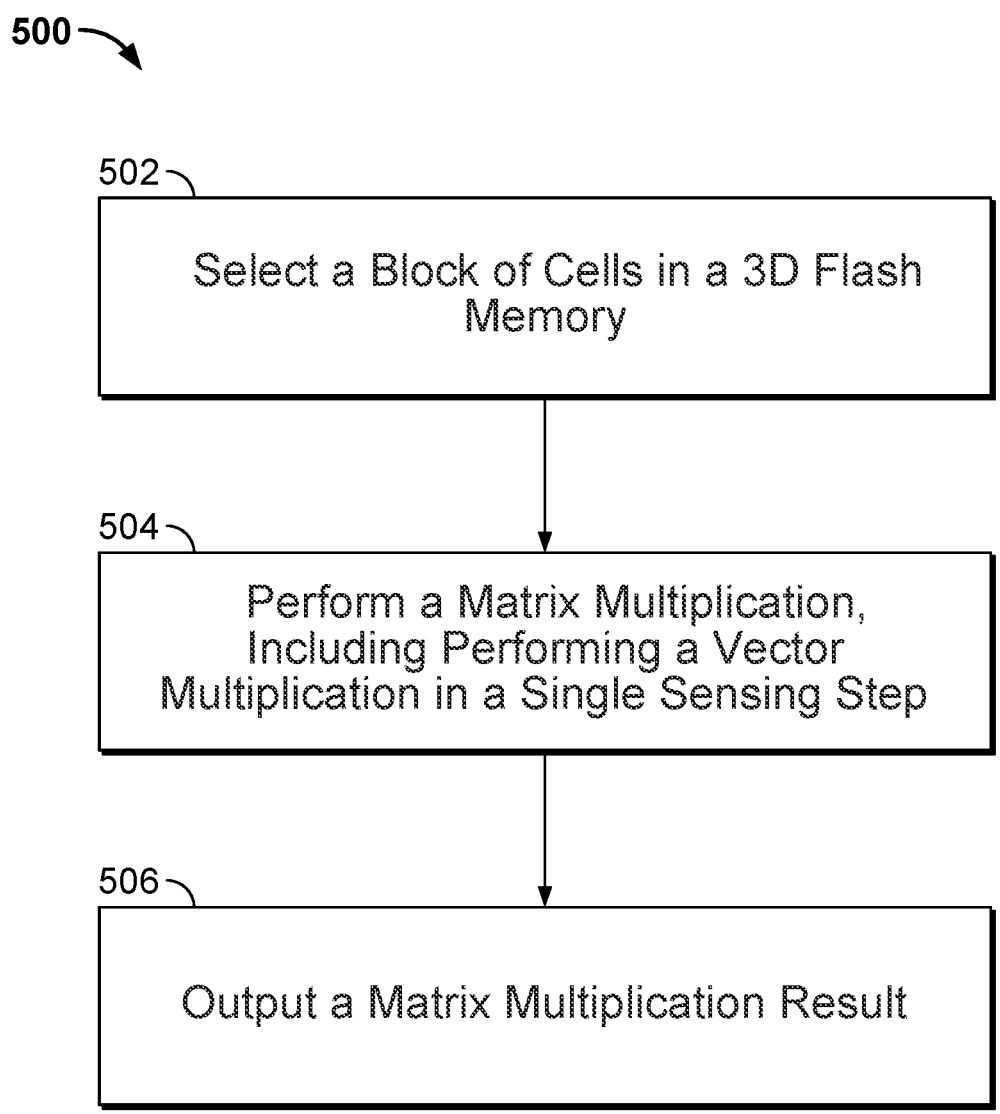
FIG. 5 is a flowchart illustrating an embodiment of a process performed by a flash memory-based AI accelerator.

FIG. 5 is a flowchart illustrating an embodiment of a process performed by a flash memory-based AI accelerator. Process 500 can be performed by a device such as 100, 200, or 300. At 502, a block of cells in the 3D flash memory is selected. In some embodiments, the 3D flash memory is a NAND memory. As described above, the block of cells is a subset of cells in the 3D flash memory, and can be selected by a controller using the control signals such as WL_sel and SGD_sel. A matrix (in particular, the weight matrix) is stored in the block of cells.

At 504, a matrix multiplication is performed on the matrix stored in the selected block of cells. The matrix multiplication includes performing a vector multiplication in a single sensing step. In some embodiments, the matrix stored in the selected block of cells is the weight matrix, and the matrix multiplication involves multiplying the weight matrix with an input activation matrix that is set through the word lines. In some embodiments, the matrix stored in the select block of cells is multiplied with a scalar value that is input by setting a voltage on the source plate. Both cases involve vector multiplication (vector-to-vector multiplication in the case of matrix-matrix multiplication, or scalar-to-vector multiplication in the case of scalar-matrix multiplication). In both cases, a vector multiplication included in the matrix multiplication is performed in a single sensing step.

At 506, a matrix multiplication result is output. As described above, the result can be output on the bit line to be sensed by the sensing circuit.

In various embodiments, the flash memory-based AI accelerator can be implemented with an external host, or as a standalone processor.

Figure 6:
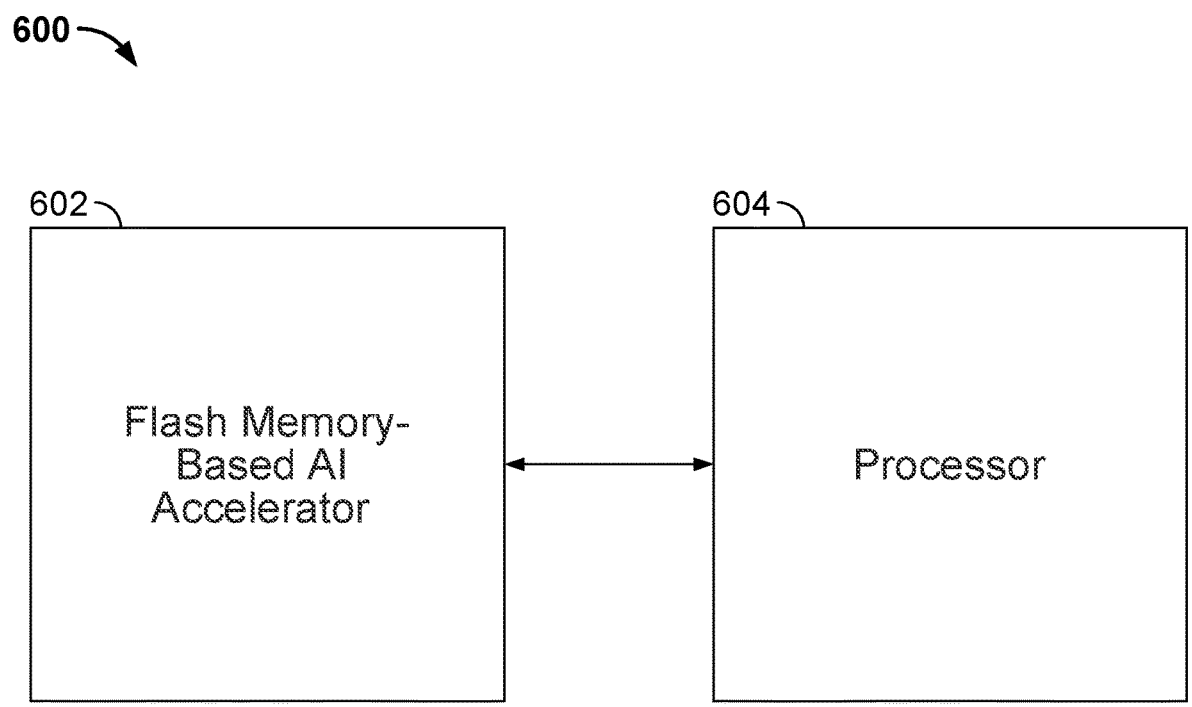
FIG. 6 is a block diagram of an example system comprising an AI accelerator with an external host.

FIG. 6 is a block diagram of an example system comprising an AI accelerator with an external host. In this example, flash memory-based AI accelerator 602 is connected with an external processor 604. The connection can be a wired or wireless connection. In some embodiments, the processor is connected to the AI accelerator via a network. The processor 604 acts as the external host that sends data and instructions to accelerator 602. In some embodiments, the processor makes application programming interface (API) calls, which invoke certain prespecified instructions that cause the AI accelerator 602's controller to configure the values stored in the flash memory and set the values of the matrix. The AI accelerator performs matrix multiplication, and outputs the multiplication result to the processor to be used in applications.

Figure 7:
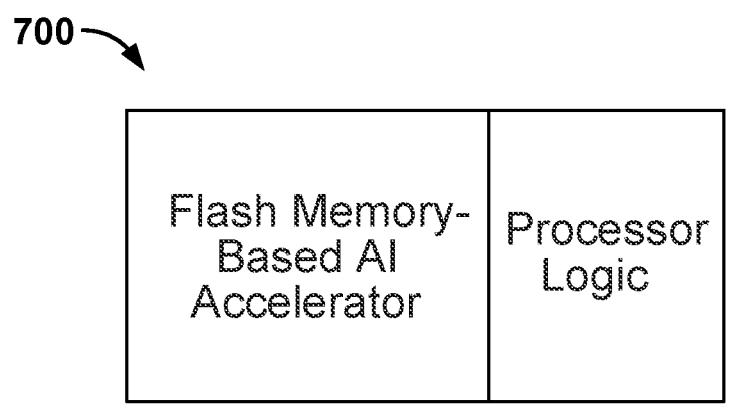
FIG. 7 is a block diagram of an embodiment of a standalone AI processor.

FIG. 7 is a block diagram of an embodiment of a standalone AI processor. In this example, a processor is integrated into flash memory-based AI accelerator 700, to function as an internal host. In some embodiments, the processor circuit is implemented on the AI accelerator's logic die. Such a configuration further reduces latency between the processor and the AI accelerator.

In systems such as 600 and 700, the command set between the host and the controller is expanded. In addition to standard operations such as reading and writing, the controller and the host further implement commands specific to AI/matrix computations, such as commands for activating the signals to select cuboids (partial matrices), performing matrix operations (including multiplying WL_sel values with the weight matrix values stored in the cuboid, and multiplying a scalar value with the weight matrix), etc.

Figure 8:
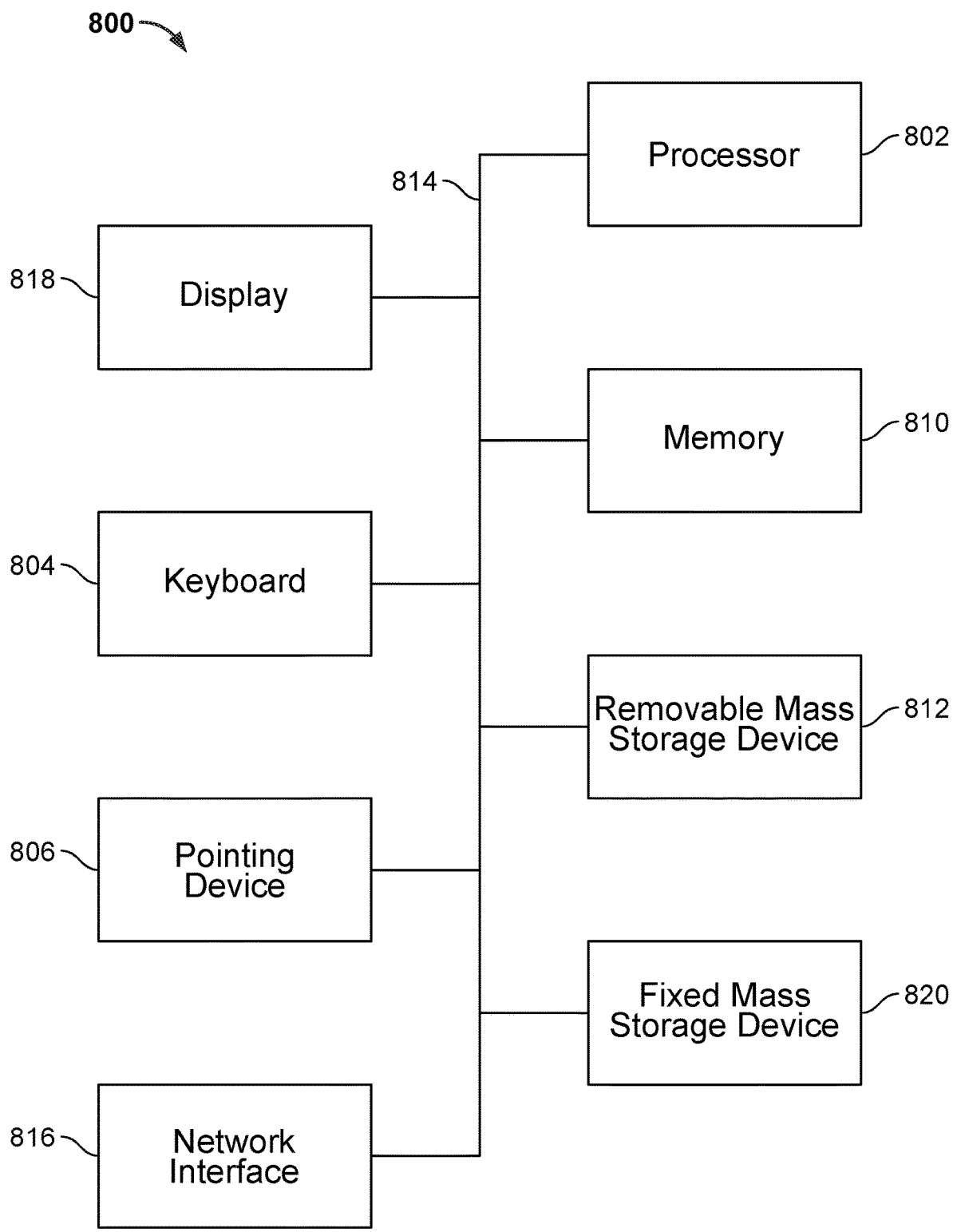
FIG. 8 is a functional diagram illustrating a programmed computer system for a host system in accordance with some embodiments.

FIG. 8 is a functional diagram illustrating a programmed computer system for a host system in accordance with some embodiments. As will be apparent, other computer system architectures and configurations can be used. Computer system 800, which includes various subsystems as described below, includes at least one microprocessor subsystem (also referred to as a processor or a central processing unit (CPU) 802). For example, processor 802 can be implemented by a single-chip processor or by multiple processors. In some embodiments, processor 802 is a general purpose digital processor that controls the operation of the computer system 800. In some embodiments, processor 802 also includes one or more coprocessors or special purpose processors (e.g., a graphics processor, a network processor, etc.). Using instructions retrieved from memory 810, processor 802 controls the reception and manipulation of input data received on an input device (e.g., image processing device 806, I/O device interface 804), and the output and display of data on output devices (e.g., display 818).

Processor 802 is coupled bi-directionally with memory 810, which can include, for example, one or more random access memories (RAM) and/or one or more read-only memories (ROM). As is well known in the art, memory 810 can be used as a general storage area, a temporary (e.g., scratch pad) memory, and/or a cache memory. Memory 810 can also be used to store input data and processed data, as well as to store programming instructions and data, in the form of data objects and text objects, in addition to other data and instructions for processes operating on processor 802. Also as is well known in the art, memory 810 typically includes basic operating instructions, program code, data, and objects used by the processor 802 to perform its functions (e.g., programmed instructions). For example, memory 810 can include any suitable computer readable storage media described below, depending on whether, for example, data access needs to be bi-directional or uni-directional. For example, processor 802 can also directly and very rapidly retrieve and store frequently needed data in a cache memory included in memory 810.

A removable mass storage device 812 provides additional data storage capacity for the computer system 800, and is optionally coupled either bi-directionally (read/write) or uni-directionally (read only) to processor 802. A fixed mass storage 820 can also, for example, provide additional data storage capacity. For example, storage devices 812 and/or 820 can include computer readable media such as magnetic tape, flash memory, PC-CARDS, portable mass storage devices such as hard drives (e.g., magnetic, optical, or solid state drives), holographic storage devices, and other storage devices. Mass storages 812 and/or 820 generally store additional programming instructions, data, and the like that typically are not in active use by the processor 802. It will be appreciated that the information retained within mass storages 812 and 820 can be incorporated, if needed, in standard fashion as part of memory 810 (e.g., RAM) as virtual memory.

In addition to providing processor 802 access to storage subsystems, bus 814 can be used to provide access to other subsystems and devices as well. As shown, these can include a display 818, a network interface 816, an input/output (I/O) device interface 804, an image processing device 806, as well as other subsystems and devices. For example, image processing device 806 can include a camera, a scanner, etc.; I/O device interface 804 can include a device interface for interacting with a touchscreen (e.g., a capacitive touch sensitive screen that supports gesture interpretation), a microphone, a sound card, a speaker, a keyboard, a pointing device (e.g., a mouse, a stylus, a human finger), a Global Positioning System (GPS) receiver, an accelerometer, and/or any other appropriate device interface for interacting with system 800. Multiple I/O device interfaces can be used in conjunction with computer system 800. The I/O device interface can include general and customized interfaces that allow the processor 802 to send and, more typically, receive data from other devices such as keyboards, pointing devices, microphones, touchscreens, transducer card readers, tape readers, voice or handwriting recognizers, biometrics readers, cameras, portable mass storage devices, and other computers.

The network interface 816 allows processor 802 to be coupled to another computer, computer network, or telecommunications network using a network connection as shown. For example, through the network interface 816, the processor 802 can receive information (e.g., data objects or program instructions) from another network, or output information to another network in the course of performing method/process steps. Information, often represented as a sequence of instructions to be executed on a processor, can be received from and outputted to another network. An interface card or similar device and appropriate software implemented by (e.g., executed/performed on) processor 802 can be used to connect the computer system 800 to an external network and transfer data according to standard protocols. For example, various process embodiments disclosed herein can be executed on processor 802, or can be performed across a network such as the Internet, intranet networks, or local area networks, in conjunction with a remote processor that shares a portion of the processing. Additional mass storage devices (not shown) can also be connected to processor 802 through network interface 816.

In addition, various embodiments disclosed herein further relate to computer storage products with a computer readable medium that includes program code for performing various computer-implemented operations. The computer readable medium includes any data storage device that can store data which can thereafter be read by a computer system. Examples of computer readable media include, but are not limited to: magnetic media such as disks and magnetic tape; optical media such as CD-ROM disks; magneto-optical media such as optical disks; and specially configured hardware devices such as application-specific integrated circuits (ASICs), programmable logic devices (PLDs), and ROM and RAM devices. Examples of program code include both machine code as produced, for example, by a compiler, or files containing higher level code (e.g., script) that can be executed using an interpreter.

The computer system shown in FIG. 8 is but an example of a computer system suitable for use with the various embodiments disclosed herein. Other computer systems suitable for such use can include additional or fewer subsystems. In some computer systems, subsystems can share components (e.g., for touchscreen-based devices such as smart phones, tablets, etc., I/O device interface 804 and display 818 share the touch sensitive screen component, which both detects user inputs and displays outputs to the user). In addition, bus 814 is illustrative of any interconnection scheme serving to link the subsystems. Other computer architectures having different configurations of subsystems can also be utilized.

An AI accelerator has been disclosed. By using a controller to select blocks of cells, such an accelerator allows single-step sensing of vector multiplication results, and can perform multiple matrix multiplications in parallel, thereby greatly improving the performance of matrix multiplication intensive applications such as AI applications.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
    a three-dimensional flash memory comprising a plurality of cells; and
    a controller coupled to the three-dimensional flash memory, configured to:
        select a block of cells in the three-dimensional flash memory, wherein:
            a matrix is stored in the block of cells; and
            the block of cells is selected by using one or more select gate drains (SGDs) and one or more word lines;
        perform a matrix multiplication on the matrix stored in the block of cells, including performing a vector multiplication in a single sensing step; and
        output a matrix multiplication result.

2. The system of claim 1, wherein the block of cells is a subset of cells in the three-dimensional flash memory.

3. The system of claim 2, wherein the three-dimensional flash memory includes a NAND flash memory.

4. The system of claim 2, wherein the selected block of cells forms a cuboid.

5. The system of claim 1, wherein:
the block of cells is a first block of cells;
the matrix is a first matrix;
the matrix multiplication is a first matrix multiplication; and
the controller is further configured to:
select a second block of cells storing a second matrix; and
perform a second matrix multiplication on the second matrix substantially in parallel with the first matrix multiplication.

6. The system of claim 1, wherein:
the matrix is a weight matrix; and
the matrix multiplication includes multiplying an activation matrix with the weight matrix.

7. The system of claim 1, wherein:
the matrix is a weight matrix;
the matrix multiplication includes multiplying an activation matrix with the weight matrix; and
to input the activation matrix includes to configure the one or more word lines.

8. The system of claim 1, wherein the matrix multiplication includes multiplying a scalar with the matrix.

9. The system of claim 1, wherein:
the matrix multiplication includes multiplying a scalar with the matrix; and
the scalar is configured by configuring a source plate voltage.

10. The system of claim 1, further including an integrated processor.

11. A method, comprising:
selecting a block of cells in a three-dimensional flash memory, wherein:
a matrix is stored in the block of cells; and
the block of cells is selected by using one or more select gate drains (SGDs) and one or more word lines;
performing a matrix multiplication on the matrix stored in the block of cells, including performing a vector multiplication in a single sensing step; and
outputting a matrix multiplication result.

12. The method of claim 11, wherein the block of cells is a subset of cells in the three-dimensional flash memory.

13. The method of claim 12, wherein the three-dimensional flash memory includes a NAND flash memory.

14. The method of claim 12, wherein the selected block of cells forms a cuboid.

15. The method of claim 11, wherein:
the block of cells is a first block of cells;
the matrix is a first matrix;
the matrix multiplication is a first matrix multiplication; and
the method further comprising:
selecting a second block of cells storing a second matrix; and
performing a second matrix multiplication on the second matrix substantially in parallel with the first matrix multiplication.

16. The method of claim 11, wherein:
the matrix is a weight matrix; and
the matrix multiplication includes multiplying an activation matrix with the weight matrix.

17. The method of claim 11, wherein:
the matrix is a weight matrix;
the matrix multiplication includes multiplying an activation matrix with the weight matrix; and
inputting the activation matrix includes to configure the one or more word lines.

18. The method of claim 11, wherein the matrix multiplication includes multiplying a scalar with the matrix.

19. The method of claim 11, wherein:
the matrix multiplication includes multiplying a scalar with the matrix; and
the scalar is configured by configuring a source plate voltage.

20. A computer program product for acceleration of matrix operations, the computer program product being embodied in a tangible computer readable storage medium and comprising computer instructions for:
selecting a block of cells in a three-dimensional flash memory, wherein:
a matrix is stored in the block of cells; and
the block of cells is selected by using one or more select gate drains (SGDs) and one or more word lines;
performing a matrix multiplication on the matrix stored in the block of cells, including performing a vector multiplication in a single sensing step; and
outputting a matrix multiplication result.

* * * * *